United States Patent [19]

Sakurai

[11] Patent Number: 4,897,704
[45] Date of Patent: Jan. 30, 1990

[54] LATERAL BIPOLAR TRANSISTOR WITH POLYCRYSTALLINE LEAD REGIONS

[75] Inventor: Hiromi Sakurai, Itami, Japan

[73] Assignee: Mitsubishi Denki Kabushiki Kaisha, Tokyo, Japan

[21] Appl. No.: 161,427

[22] Filed: Feb. 24, 1988

[30] Foreign Application Priority Data

Jan. 10, 1983 [JP] Japan ................................. 58-3141

[51] Int. Cl.$^4$ ........................................... H01L 29/72
[52] U.S. Cl. ........................................ 357/35; 357/34; 357/59; 357/67
[58] Field of Search ..................... 357/34, 59 H, 67 S, 357/61, 35

[56] References Cited

U.S. PATENT DOCUMENTS

| | | | |
|---|---|---|---|
| 3,189,973 | 6/1965 | Edwards et al. | 357/59 J X |
| 3,600,651 | 8/1971 | Duncan | 317/235 R |
| 3,677,837 | 7/1972 | Ashar | 357/34 X |
| 3,980,900 | 9/1976 | Ishigaki et al. | 357/34 X |
| 4,038,680 | 7/1977 | Yagi et al. | 357/34 X |
| 4,190,855 | 2/1980 | Inoue | 357/72 X |
| 4,319,932 | 3/1982 | Jambotkar | 357/34 X |
| 4,377,619 | 3/1983 | Schonhorn et al. | 428/333 |
| 4,451,844 | 5/1984 | Komatsu et al. | 357/59 H |
| 4,452,645 | 6/1984 | Chu et al. | 357/34 X |
| 4,495,512 | 1/1985 | Isaac et al. | 357/34 |
| 4,604,644 | 8/1986 | Beckham et al. | 357/80 |
| 4,745,018 | 5/1988 | Chihara et al. | 429/141 |

FOREIGN PATENT DOCUMENTS

| | | | |
|---|---|---|---|
| 50-34053 | 11/1975 | Japan . | |
| 0525275 | 1/1977 | Japan | 357/34 X |
| 55-87448 | 7/1980 | Japan . | |
| 56-54064 | 5/1981 | Japan | 357/34 X |
| 58-52833 | 3/1983 | Japan . | |
| 59-44834 | 3/1984 | Japan . | |

OTHER PUBLICATIONS

Chang, "Self-Aligned Bipolar Transistors", *IBM Technical Disclosure Bulletin*, vol. 21, No. 7, Dec. 1978, pp. 2761–2762.
Silvestri et al., "Integrated Circuit Processing Concept", *IBM Technical Disclosure Bulletin*, vol. 22, No. 11, Apr. 1980, pp. 5155–5156.
Nakamura et al., "Self-Aligned Transistor with Sidewall Base Electrode", *IEEE Journal of Solid-State Circuits*, vol. SC-17, No. 2, Apr. 1982, pp. 226–230.
Horng et al., *IBM Technical Disclosure Bulletin*, "Self-Aligned Submicron Bipolar Transistor Process", vol. 23, No. 7B, Dec. 1980, pp. 3242–3245.
Ning et al., "Bipolar Transistor Structure with Extended Metal Base Contacts and Diffused or Implanted Emitter", *IBM Technical Disclosure Bulletin*, vol. 22, No. 5, (Oct. 1979), pp. 2123–2126.
"A New Transistor Structure for High-Speed Bipolar LSI", H. Sakurai et al., *Japanese Journal of Applied Physics*, vol. 19 (1980) Supplement 19-1, pp. 181–185.

*Primary Examiner*—William Mintel
*Attorney, Agent, or Firm*—Birch, Stewart, Kolasch & Birch

[57] ABSTRACT

A semiconductor device of a type of a sidewall base contact structure transistor, comprising a semiconductor substrate of first conductive type; a transistor structure including a first collector region of a second conductive type, a second collector region of the second conductive type the impurity density of which region is lower than that of the first collector region, a base region of the first conductive type, and an emitter region of the second conductive type, each of the four regions being composed of a single crystalline semiconductor layer, formed one after another in the mentioned order on the main surface of the semiconductor substrate; an insulating layer provided on the main surface of the semiconductor substrate, surrounding the first and second collector regions, the base region, and the emitter region; a collector lead region embedded in the insulating layer, one end of the region being in contact with the side wall of the first collector region, the other end of the region being exposed from a part of the surface of the insulating layer; a base lead region embedded in the insulating layer, one end of the region being in contact with the side wall of the base region, the other end of the region being exposed from a part of the surface of the insulating layer other than the part where the other end of the collector lead region is exposed.

4 Claims, 4 Drawing Sheets

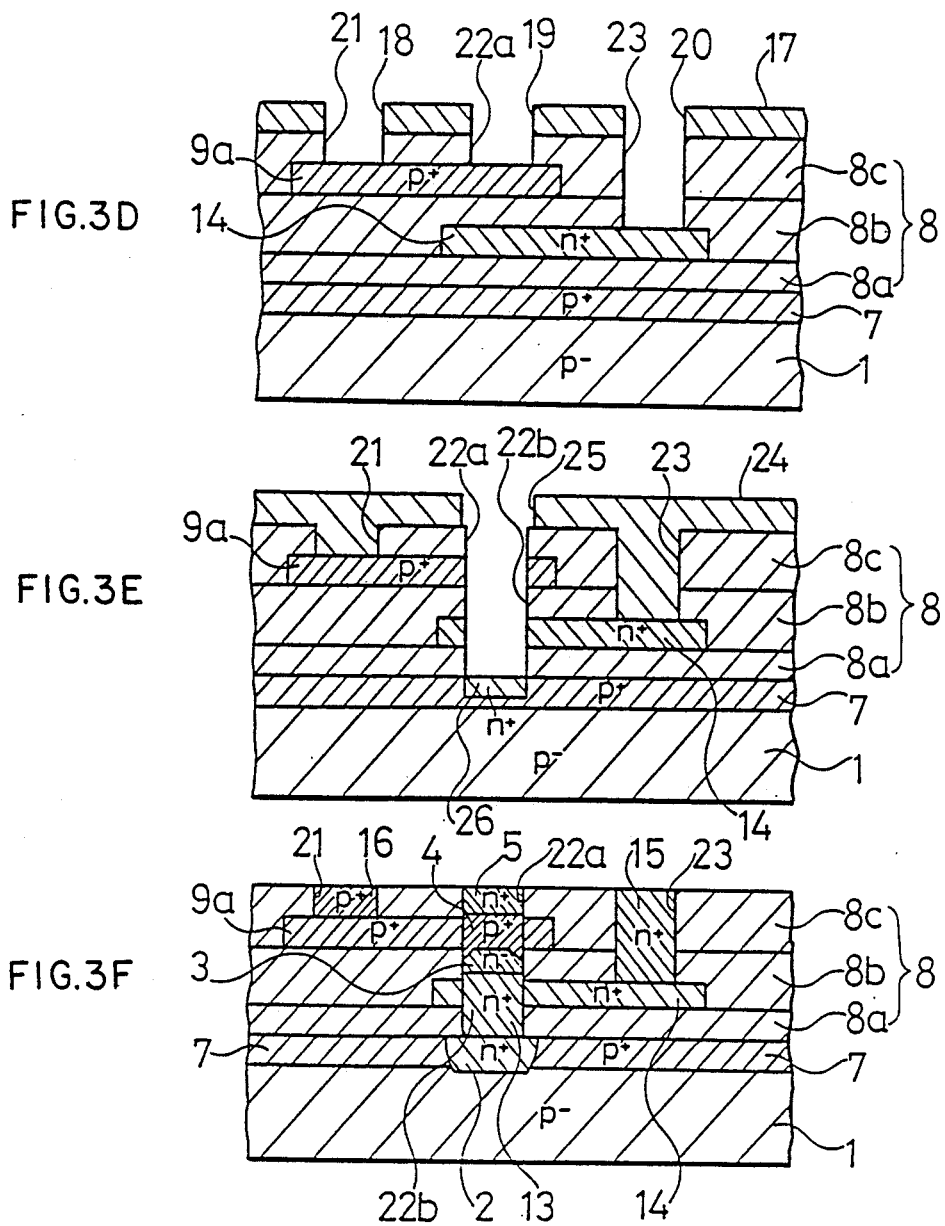

LATERAL BIPOLAR TRANSISTOR WITH POLYCRYSTALLINE LEAD REGIONS

This application is a continuation of application Ser. No. 861,755, filed on May 9, 1986, now abandoned, which is a continuation of application Ser. No. 566,682, filed on Dec. 29, 1983, now abandoned.

FIELD OF THE INVENTION

The present invention relates to a semiconductor device, especially to a sidewall base contact structure transistor which is abbreviated as SICOST.

BACKGROUND OF THE INVENTION

Recently, there is a trend for obtaining size reduction and high integration in bipolar LSI (Large Scale Integration). Accordingly, in transistors that are used in bipolar LSI, the size reduction of transistors is increasing with the use of size reduction processes such as the photolithography technique, the dry-etching technique and so on, in addition to the technique of oxide isolation used in conventional structures. Additionally there are many proposals for transistors which are of new structures and made by using new techniques of oxide isolation.

In a SICOST which is recited in IEEE Transactions on Electron Devices "Self-Aligned Transistor with Sidewall Base Electrode" by T. Nakamura et al., Vol. ED-29, No. 4, Apr. 1982, P. 596–600, it is disclosed that it is possible to reduce a collector-base junction capacity $C_{TC}$ and an emitter-base junction capacity $C_{TE}$ to a great extent. This is done by constructing a collector-base junction and an emitter-base junction only in both of the main surface portions of an active base region and, not constructing any junctions for an inactive base region, thereby enhancing the performance of bipolar LSIs by using SICOSTs to a great extent.

FIG. 1 is a cross-sectional view showing a prior art SICOST.

In FIG. 1, the numeral 1 designates a p⁻ type silicon substrate 1, and an n⁺ type embedded collector layer 2 is provided in a part of the main surface region of the silicon substrate 1. An n⁻ type collector region 3, a p⁺ active base region 4, and an n⁺ type emitter region 5, each of the three regions being composed of a single crystalline silicon layer, overlap one after another in the mentioned order on a part of the surface of the embedded collector layer 2, thereby constituting an npn transistor of n⁻p⁺n⁺ structure. An n⁺ type collector leading region 6, composed of a single crystalline silicon layer, is provided on a part of the n⁺ type embedded collector layer 2 apart from the collector region 3. A p⁺ type channel cut region 7 is provided on the whole main surface of the p⁻ type silicon substrate 1 except for the part where the n⁺ type embedded collector layer 2 is provided. A SiO₂ film 8 is provided over the surface of the n⁺ type embedded collector layer 2 and the surface of the p⁺ type channel cut region 7, and it surrounds the n⁻ type collector region 3, the p⁺ type active base region 4, the n⁺ type emitter region 5, and the n⁺ type collector leading region 6. A p⁺ type inactive polycrystalline base region 9, composed of a p⁺ type polycrystalline silicon layer, is provided embedded in the SiO₂ film 8, and one end of the base region 9 is provided in contact with and surrounding a given part of the side wall of the p⁺ type active base region 4. A base electrode 10, composed of an aluminum (Al) film, is provided in contact with the other end of the p⁺ type inactive polycrystalline base region 9 through a contact hole produced in the part of the SiO₂ film 8 which part is located on the other end of the base region 9. An emitter electrode 11, composed of an Al film, is provided in contact with the n⁺ type emitter region 5. A collector electrode 12, composed of an Al film, is provided in contact with the n⁺ type collector leading region 6.

In this prior art device, the n⁻ type collector region 3, the p⁺ type active base region 4, and the n⁺ type emitter region 5 overlap one after another in the mentioned order on the n⁺ type embedded collector layer 2. Accordingly, a collector-base junction and an emitter-base junction are constituted only in the junction between the p⁺ type active base region 4 and the n⁻ type collector region 3 and in the junction between the p⁺ type active base region 4 and the n⁺ type emitter region 5 respectively, and no pn junctions are created between the p⁺ type inactive base region 9 and the n⁻ type collector region 3 and between the inactive base region 9 and the n⁺ type emitter region 5. This is an alteration of the conventional structure of a transistor where the base region is constructed in a part of the surface portion of the collector region and the emitter region is constructed in a part of the surface portion of the base region. This means that the above-described transistor is constructed by removing the emitter-base junction that is made between the side wall of the emitter region and the inactive base region, which is the portion of the base region except for the active base region under the emitter region also, collector-base junction that exists between the inactive base region and the collector region.

The above described transistor it is capable of reducing the collector-base junction capacity $C_{TC}$ and the emitter-base junction capacity $C_{TE}$ to a greater extent than transistors of a conventional structure. The capability of reducing the emitter-base junction capacity $C_{TE}$ becomes more important as fineness of the structure advances. For example, when the area of the emitter region is 0.5 μm square and the diffusion depth of impurities is 0.4 μm, the area of the bottom of the emitter region becomes 0.25 μm² (=0.5×0.5), and the area of the side wall thereof becomes 0.8 μm² (=0.5×4×0.4). The ratio of the emitter-base junction capacity $C_{TE}$ of the prior art device of FIG. 1 relative to the emitter-base junction capacity $C_{TE}$ of the transistors of conventional structure is ¼ because it is a ratio of the area of the bottom of the emitter region that is in contact with the base region (which is 0.25 μm²) relative to the area which is obtained by adding the area of the side wall of the emitter region that is in contact with the inactive base region (which is 0.8 μm²) to the above mentioned area of the bottom of the emitter region (0.25 μm²), which is about 1 μm² (=0.25+0.8).

It is possible to make the ratio of the junction capacitances $C_{TE}$ of both transistors smaller than the above mentioned ratio of capacitances by making the impurity density of the surface portion of the emitter region higher than that of the bottom portion, thereby enhancing the performance of the bipolar LSI using this prior art device.

The advantages of this prior art device are described in the following concrete example.

Generally, in an emitter coupled logic (which is abbreviated as ECL) which is constituted by a current switching transistor and an emitter follower transistor, a propagation delay time $t_{pd}$ is represented by the following formula.

$$t_{pd} = 0.7 r_{bb'} \cdot C_{IN} + 0.7 R_C(C_{TS} + C_R) + 0.5 \times [0.7 \times (R_C + r_{bb'}) C_{INEF} + 0.5 \Delta V_o \cdot C_{EF}/I_{EF}] \quad (I)$$

where
$R_C = \Delta V_o / I_{CS}$
$C_{IN} = 2 C_{TC} + 0.5 C_{TE} + I_{SC}/(2 f_T \cdot \Delta V_{IN})$ ... equivalent input capacity (Unit: F)
$C_{TS}$ ... collector-substrate junction capacity (Unit: F)
$r_{bb'}$ ... base resistance (Unit: Ω)
$\Delta V_{IN}$ ... input logical amplitude (Unit: V)
$\Delta V_o$ ... output logical amplitude (Unit: V)
$C_R$ ... parasitic capacity of collector load (Unit: F)
$L_{CS}$ ... switching current (Unit: A)
and the "EF" ... represents that the value is related to the emitter follower transistor When a prior art SICOST is used in constituting a current switching transistor and an emitter follower transistor of an ECL, the current switching transistor and the emitter follower transistor have the same structure and the above formula [I] is revised to formula [II] shown below. The following constants are presumed considering fineness of structure, thereby making it easy to understand the ratio caused by only the junction capacities.

$C_{EF} = C_{IN}$ (where it is presumed that the emitter follower transistor drives a gate of the next stage only)
$I_{EF} = I_{CS} = 300$ (μA), $C_R = 0.014$ (pF)
$r_{bb'} = 200$ (Ω)
$\Delta V_o = \Delta V_{in} = 0.6$ (V), $f_T = 5$ (GHz)
$t_{pd} = 2.820 C_{TC} + 0.705 C_{TE} + 1.400 C_{TS} + 0.042$ (nsec) . . . [II]

where the unit of the capacities $C_{TC}$, $C_{TE}$ and $C_{TS}$ is pF.

Although the capability of reducing the junction capacities $C_{TC}$ and $C_{TE}$ contributes largely to shortening the propagation delay time $t_{pd}$ in an ECL using this prior art device, it is necessary to minimize the collector-substrate junction capacity $C_{TS}$ in order to bring about a greater reduction of the delay time. However, it is not easy to minimize the collector-substrate junction capacity $C_{TS}$ caused by the pn junction between the n+ type embedded collector layer 2 and the p+ type silicon substrate 1 and between the embedded collector layer 2 and the p+ type channel cut region 7 because the n− type collector region 3 and the n+ type collector leading region 6 must be provided on the surface of the embedded collector layer 2 thereby resulting in the incapability of reducing the dimension of the n+ type embedded collector layer 2.

OBJECTS AND SUMMARY OF THE INVENTION

The present invention is directed to solve the problem described above, and has for its object to provide a semiconductor device of SICOST structure which has a small collector-substrate junction capacity $C_{TS}$.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, the dimension of an embedded collector layer is reduced by not constructing an embedded collector layer between the collector region and the collector leading region.

BRIEF DESCRIPTION OF THE DRAWINGS

FIG. 3 (G) is a schematic view of a second embodiment of the present invention including an additional emitter region 17.

DETAILED DESCRIPTION OF THE INVENTION

Figure 1:
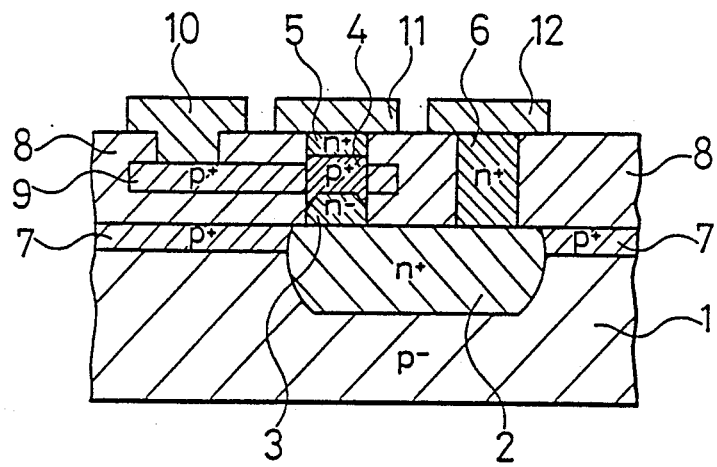
FIG. 1 is a schematic view showing a cross-section of a prior art SICOST.
Figure 2:
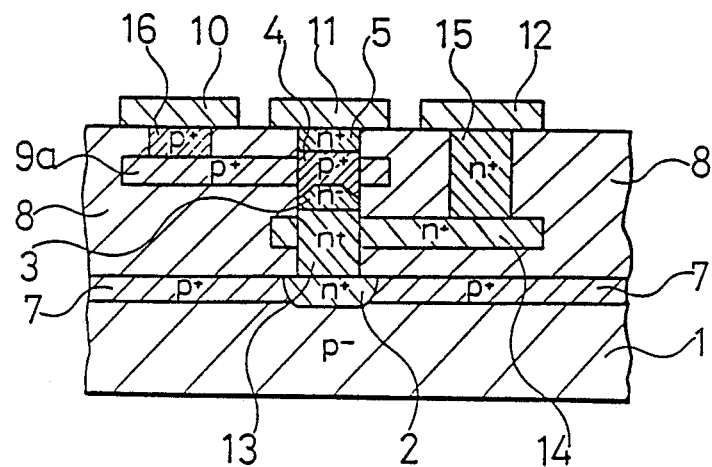
FIG. 2 is a schematic view showing a cross-section of a SICOST, an embodiment of the present invention.

FIG. 2 is a cross-sectional view showing a SICOST which is a preferred embodiment of the present invention, and like numerals are used to designate like parts or elements as in FIG. 1. In FIG. 2, the numeral 9a designates a first p+ type polycrystalline base leading region corresponding to the p+ type inactive polycrystalline base region 9 of the prior art device of FIG. 1. An n+ type collector region 13, composed of polycrystalline silicon layer, is provided between the n− type collector region 3 and that part of the surface region of the n+ type embedded collector layer 2 which part corresponds to the n− type collector region 3. A first n+ type polycrystalline collector leading region 14, composed of an n+ type polycrystalline silicon layer, is embedded in the SiO₂ film 8, and one end of the region 14 is in contact with and surrounding a given part of the side wall of the n+ type collector region 13, the other end of the region 14 is being connected with the second n+ type polycrystalline collector leading region 15. The second n+ type polycrystalline collector leading region 15, composed of an n+ type polycrystalline silicon layer, is provided in contact with the first n+ type polycrystalline collector leading region 14 in a contact hole which is produced in that part of the SiO₂ film 8 which part is located on the other end of the first n+ type polycrystalline collector leading region 14. A second p+ type polycrystalline base leading region 16, composed of a p+ type polycrystalline silicon layer, is provided in contact with the first p+ type polycrystalline base leading region 9a in a contact hole which is produced in that part of the SiO₂ film 8 which part is located on the other end of the base leading region 9a in an opposite side to the p+ type active base region 4. Heretofore, a base electrode 10 is connected with the second p+ type polycrystalline base leading region 16, and a collector electrode 12 is connected with the second n+ type polycrystalline collector leading region 15.

A process of manufacturing of the embodiment mentioned above is described with reference to the drawings FIG. 3(A) through (F) which are cross-sectional views showing its main stages.

Figure 3A:
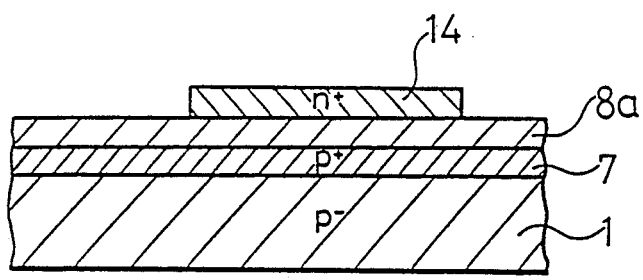
FIG. 3 (A) through (F) are schematic views showing a plurality of main stages in the process of manufacturing the embodiment of FIG. 2.

As shown in FIG. 3(A), the p+ type channel cut region 7 is produced by introducing p type impurities into the main surface portion of the p− type silicon substrate 1, and the first SiO₂ film 8a is formed on the surface of the p+ type channel cut region 7 by an oxidization process such that its thickness becomes about 3000 Å.

Figure 3B:
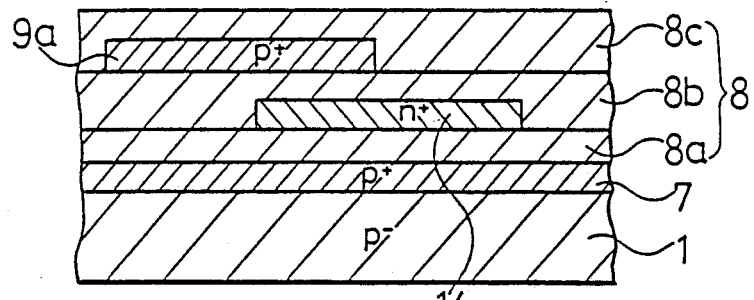

At the next stage, the first polycrystalline silicon layer is formed selectively on that part of the surface of the first SiO₂ film 8a which part corresponds to the portion where the first n+ type polycrystalline collector leading region 14 should be produced. N type impurity ions, for example, ions of arsenic (As) and phosphorus (P), are implanted into the first polycrystalline silicon layer, and after the implantation process the diffusion of the n type impurity ion is conducted accompanied by the recovery of damages caused by the implantation of n type impurity ions into the first polycrystalline silicon layer by a heating process in the atmosphere of nitrogen (N₂) at 1050° C., thereby producing the first n+ type polycrystalline collector leading region 14. Thereafter, as shown in FIG. 3(B), the second SiO₂ film 8b is formed on the surface of the first n+ type polycrystalline collector leading region 14 and on the surface of the first SiO₂ film 8a by a sputtering process or a chemical vapor deposition process such that its thickness on the surface of the first n+ type polycrystalline collector leading region 14 becomes about 3000 Å. Furthermore, the second polycrystalline silicon layer of about 4000 Å thickness is formed selectively on that part of the surface of the second SiO₂ film 8b which part corresponds to the portion where the first p+ type polycrystalline base leading region should be produced. Thereafter, p type impurity ions, ions of boron (B), for example, are implanted into the second polycrystalline silicon layer, and the diffusion of the impurity ion is conducted accompanied by the recovery of damage caused by the implantation of p type impurity ions into the second polycrystalline silicon layer by a heating process in the atmosphere of nitrogen (N₂) at 1050° C., thereby producing the first p+ type polycrystalline base leading region 9a. Then, the third SiO₂ film 8c is formed on the surface of the first p+ type polycrystalline base leading region 9a and on the surface of the second SiO₂ film 8b by a spattering process or a chemical vapor deposition process such that its thickness on the surface of the base leading region 9a becomes more than 3000 Å. The first SiO₂ film 8a, the second SiO₂ film 8b, and the third SiO₂ film 8c constitute the SiO₂ film 8 as shown in FIG. 2.

Figure 3C:
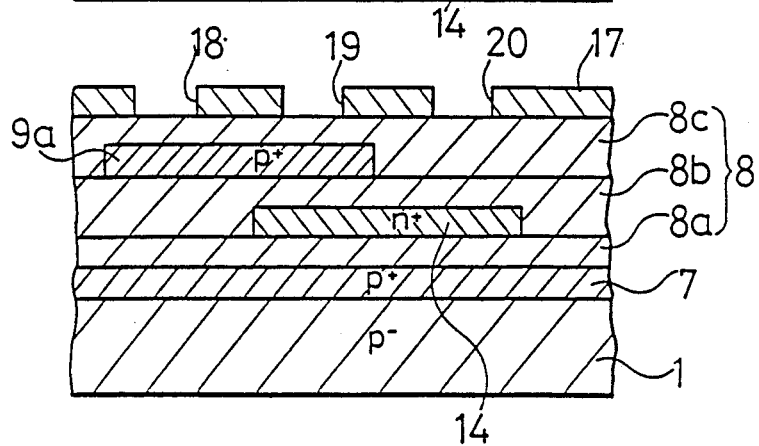

At the next stage, as shown in FIG. 3(C), a resist film 17 as etching mask is formed on the surface of the third SiO₂ film 8c. The resist film 17 has an aperture 18 located in the portion corresponding to that portion of the surface of the first p+ type polycrystalline base leading region 9a where the second p+ type polycrystalline base leading region should be produced, an aperture 19 located in the portion corresponding to that portion of the surface of the p+ type channel cut region 7 where the n+ type collector region 13, the n− type collector region 3, the p+ type active base region 4, and the n+ type emitter region 5 should be produced overlapping one after another in the mentioned order, and an aperture 20 which is located in the portion corresponding to that portion of the surface of the first n+ type polycrystalline collector leading region 14 where the second n+ type polycrystalline collector leading region should be produced.

Thereafter, as shown in FIG. 3(D), a contact hole 21 which extends from the surface of the SiO₂ film 8c to the surface of the first p+ type polycrystalline base leading region 9a is produced in the portion of the third SiO₂ film 8c corresponding to the aperture 18 of the resist film 17. The contact hole 21 is used to make the second p+ type polycrystalline base leading region therein. A contact hole 22a is produced in the portion of the third SiO₂ film 8c corresponding to the aperture 19 of the resist film 17 by a reactive ion etching process using the resist film 17 as a mask. The contact hole 22a is used to make the n+ type emitter region therein. At the same time, a contact hole 23 which extends from the surface of the SiO₂ film 8c to the surface of the first n+ type polycrystalline collector leading region 14 is produced in the portions of the third SiO₂ film 8c and the second SiO₂ film 8b corresponding to the aperture 20 of the resist film 17 by the same process. The contact hole 23 is used to make the second n+ type polycrystalline collector leading region therein. It is possible to produce the contact holes 21, 22a, 23 easily and at the same time because the etching speed of SiO₂ film in the reactive ion etching process is greater than the ten times of the etching speed of a polycrystalline silicon layer. Furthermore, the configurations in the cross-section of the contact holes 21, 22a, 23 become approximately the same as those of the apertures 18, 19, 20 respectively because the side-etching occurs only slightly in the reactive ion etching process.

Thereafter, as shown in FIG. 3(E), the resist film 17 is removed from the surface of the third SiO₂ film 8c, and a new regist film 24 which occupies the contact holes 21, 23 and has an aperture 25 located in the portion corresponding to the contact hole 22a is formed on the surface of the third SiO₂ film 8c. A contact hole 22b which extends from the surface of the first p+ type polycrystalline base leading region 9a to the surface of the p+ type channel cut region 7 is produced at the portions of the first p+ type polycrystalline base leading region 9a, the SiO₂ film 8b, the first n+ type polycrystalline collector leading region 14, and the SiO₂ film 8a corresponding to the contact hole 22a, through the aperture 25 and the contact hole 22a by a reactive ion etching process using the resist film 24 as a mask. Then, the n+ type ion implanted layer 26 which becomes the n+ type embedded collector layer is produced at the portion of the surface region of the p+ type channel cut region 7 which portion is exposed in the contact hole 22b by implanting n type impurities, As or P, for example, through the aperture 25 of the regist film 24 and the contact holes 22a, 22b thereinto.

Thereafter, as shown in FIG. 3(F), the epitaxial growth of n− type silicon layer which has a resistivity of approximately 1 to 2 cm is conducted on the portion of the surface of the first p+ type polycrystalline base leading region 9a which is exposed in the contact hole 21, and on the portion of the surface of the n+ type ion implanted layer 26 which is exposed in the contact holes 22a, 22b, and further on the portion of the surface of the first n+ type polycrystalline collector leading region 14 which is exposed in the contact hole 23. At this time, because a single crystalline silicon layer is produced on a single crystalline silicon layer, a polycrystalline silicon layer is produced on a polycrystalline silicon layer by crystal growth, and the crystal growth does not occur on SiO₂ film, the n− type polycrystalline silicon layers are produced on the portion of the surface of the first p+ type polycrystalline base leading region 9a which is exposed in the contact hole 21 and on the portion of the surface of the first n+ type polycrystalline collector leading region 14 which is exposed in the contact hole 23, and the n− type single crystalline silicon layer is produced on the portion of the surface of the n+ type ion implanted layer 26 which is exposed in the contact holes 22a, 22b. While the n− type single crystalline silicon layer is produced as mentioned above, the n+ type collector region 13 is produced at the end of the n⁻ type single crystalline silicon layer which end is in contact with the n+ type ion implanted layer 26 and the first n+ type polycrystalline collector leading region 14 by the diffusion of n type impurity ions of the n+ type ion implanted layer 26 and the diffusion of n type impurities of the first n+ type polycrystalline collector leading region 14. At the same time the p+ type active base region 4 is produced at the portion in contact with the first p+ type polycrystalline base leading region 9a by the diffusion of the p type impurities of the region 9a accompanied by the n⁻ type collector region 3 being produced between the p+ type active base region 4 and the n+ type collector region 13. Finally, at the same time the n+ type embedded collector layer 2 is produced by the diffusion of the n type impurity ions of the n+ type ion implanted layer 26 into the p+ type channel cut region 7 and the p⁻ type silicon substrate 1. Then, the n+ type emitter region 5 which is in contact with the p+ type active base region 4 is produced in the contact hole 22a and the second n+ type polycrystalline collector leading region 15 which is in contact with the first n+ type polycrystalline collector leading region 14 is produced in the contact hole 23 by conducting an implantation and a diffusion of n type impurity ions, i.e., As, P, into the end of the n⁻ type single crystalline silicon layer in the contact hole 22a and into the n⁻ type polycrystalline silicon layer in the contact hole 23. It is possible to produce the n+ type emitter region 5 and the second n+ type polycrystalline collector leading region 15 at the same time because the diffusion speed of impurities into a polycrystalline silicon layer is faster than that of into a single crystalline silicon layer. Thereafter, the second p+ type polycrystalline base leading region 16, which is in contact with the first p+ type polycrystalline base leading region 9a is produced in the contact hole 21 by conducting an implantation and a diffusion of p type impurities, boron (B), for example into the n⁻ type polycrystalline silicon layer in the contact hole 21.

Finally, as shown in FIG. 2, the base electrode 10, the emitter electrode 11, and the collector electrode 12 are produced and connected with the second p+ type polycrystalline base leading region 16, the n+ type emitter region 5, and the second n+ type polycrystalline collector leading region 15 respectively, thereby obtaining the preferred embodiment of the present invention.

In this preferred embodiment, the n+ type collector region 13, the n⁻ type collector region 3, the p+ type active base region 4, and the n+ type emitter region 5 are produced overlapping one after another in the mentioned order, unlike the prior art device shown in FIG. 1. So, in this embodiment it is possible to reduce the dimension of the n+ type embedded collector layer 2 compared to that of the prior art device of FIG. 1. It is also possible to reduce the collector-substrate junction capacitance $C_{TS}$ based on the p-n junctions constituted between the n+ type embedded collector layer 2 and the p⁻ type silicon substrate 1 and between the embedded collector layer 2 and the p+ type channel cut region 7 up to one quarter of that of the prior art device of FIG. 1. For example, when the area of the main surface of the n+ type emitter region 5 is 0.25 $\mu m^2$ (=0.5×0.5), the emitter-base junction capacitance $C_{TE}$ is 0.007 pF, the collector-base junction capacitance $C_{TC}$ is 0.030 pF, and the collector-substrate junction capacitance $C_{TS}$ is 0.090 pF respectively in the prior art device in FIG. 1. In contrast, the collector-substrate junction capacitance $C_{TS}$ of the preferred embodiment of the present invention is 0.023 pF while the junction capacitance $C_{TE}$ and $C_{TC}$ are the same as those of the prior art device. Accordingly, it is possible to achieve an improvement of 34% on it because the propagation delay time $t_{pd}$ of the ECL using the above described embodiment is 0.164 nsec in contrast to the delay time of ECL using the prior art device which is 0.250 nsec.

A further advantage of the embodiment is that it is possible to make the thickness of the $SiO_2$ film 8, 5/3 times that of the prior art device. The following description is given with respect to the capacity of wirings of LSI. In the case of using Al wirings, a delay time of 0.1 nsec per 1 mm of the Al wiring is unavoidable, when the width of the Al wiring of the first layer is 4.5 $\mu m$ in the prior art device. However, in the preferred embodiment of the present invention is possible to shorten the delay time up to 0.06 nsec because the delay time is determined by the capacitance between the Al wiring and the substrate, and the thickness of the $SiO_2$ film 8 is 5/3 times of the prior art device. This advantage of decreasing the delay time caused by the Al wiring is especially important because of the large proportion of the propagation delay time caused by the Al wiring to the whole length thereof, as evident from comparison with the delay time in the above-mentioned ECL. For example, in the case that the length of the Al wiring is about 3 mm as occurs frequently in a gate array LSI, the propagation delay time $t_{pd}$ is 0.550 nsec (=0.250+3×0.1) in the prior art device. In contrast, $t_{pd}$ is 0.344 nsec (=0.164+3×0.06) in the preferred embodiment, resulting in a 40% enhancement of the performance of the device. When the features and effects of Fan-In and Fan-Out are considered, the advantage may be greater because of the decrease of the junction capacitance.

Figure 3G:
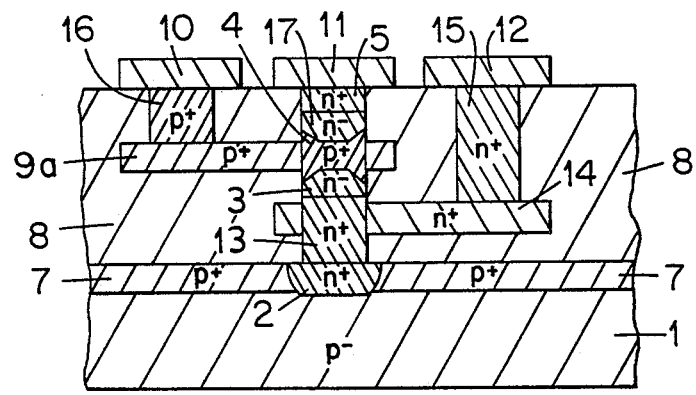

The above-described embodiment is that of npn transistor of n+p+n⁻n+ structure comprising the n+ type emitter region 5, the p+ type active base region 4, the n⁻ type collector region 3, and the n+ type collector region 13. In view of circuit performance, in some cases npn transistors of this type may desirably have a bi-directional property of the current gain which is defined as having equal gains in up and down directions. In order to obtain these characteristics, it is enough to add an n⁻ type emitter region 17 between the n+ type emitter region 5 and the p+ type active base region 4 as shown in FIG. 3(G), thereby easily obtaining an npn transistor of n+n⁻p+n⁻n+ structure which has a bi-directional property. The invention is capable of realizing an npn transistor which has a complete bi-directional property by producing the emitter region in the same configuration as that of the collector region. Transistors of such complete bi-directional property effect free selection between emitter and collector regions for circuit design increasing the freedom in circuit design to a greater extent. This is especially advantageous in arranging npn transistors, thereby resulting in high integration.

Although the first p+ type polycrystalline base leading region 9a, the second p+ type polycrystalline base leading region 16, the first n+ type polycrystalline collector leading region 14, and the second n+ type polycrystalline collector leading region 15 are made of polycrystalline silicon layers in the above-described embodiment, these may be made of other layers than polycrystalline silicon layer, for example, polycrystalline siliside layers which are composed of compounds of metal and polycrystalline silicon.

Furthermore, an n⁻ type silicon substrate can be used as a substrate instead of the p⁻ type silicon substrate 1 which is used in the above described embodiment; in this case, however, it is required to replace p type regions by n type regions and n type regions by p type regions.

As described in the foregoing, a semiconductor device of the present invention has a semiconductor substrate of a first electrically conductive type;

a transistor structure including a first collector region of a second electrically conductive type, a second collector region of the second conductive type the impurity density of which region is lower than that of the first collector region, a base region of the first conductive type, and an emitter region of the second conductive type, each of the four regions being overlapping one after another in the mentioned order on the main surface of the semiconductor substrate;

an insulating layer provided on the main surface of the semiconductor substrate, surrounding the first and second collector regions, the base region, and the emitter region;

a collector leading region embedded in the insulating layer, one end of the region being in contact with the side wall of the first collector region, the other end of the region being exposed from a part of the surface of the insulating layer; and a base leading region embedded in the insulating layer, one end of the region being in contact with the side wall of the base region, the other end of the region being exposed from a part of the surface of the insulating layer other than the part where the other end of the collector leading region is exposed.

Because of the structure it is possible to reduce the dimension of the embedded collector layer in contrast to that of the prior art device. Accordingly, it is possible to reduce the collector-substrate junction capacitance $C_{TS}$ caused by the pn junction constituted between the embedded collector layer and the silicon substrate, thereby effecting the enhancement of the performance of the devices using the semiconductor device of the present invention.

What is claimed is:

1. A semiconductor device comprising:

a silicon substrate of a first electrically conductive type;

an embedded collector layer of a second electrically conductive type opposite to said first electrically conductive type formed in said substrate, said embedded collector layer including first and second portions having predetermined surface areas, wherein said first portion of said embedded collector layer forms a PN junction with said substrate;

a transistor structure disposed above said substrate including, a first collector region of said second electrically conductive type having a surface area substantially the same as said predetermined surface area of said first portion formed on said second portion of said embedded collector layer, a second collector region of said second electrically conductive type having a surface area substantially the same as said predetermined surface area of said first portion formed on said first collector region having an impurity density lower than that of said first collector region, a base region of said first electrically conductive type having a surface area substantially the same as said predetermined surface area of said first portion formed on said second collector region, and a first emitter region of said second electrically conductive type having a surface area substantially the same as said predetermined surface area of said first portion formed on said base region, wherein said first collector region, said second collector region, said base region, and said emitter region comprise a single crystalline silicon layer;

an insulating layer provided on said substrate and surrounding said transistor structure;

a first polycrystalline collector lead region formed in said insulating layer comprising said second electrically conductive type, said first collector lead region including first and second portions, wherein said first portion of said first collector lead region contacts said first collector region;

a second polycrystalline collector lead region formed in said insulating layer comprising said second electrically conductive type, said second collector lead region including first and second portions, wherein said first portion of said second collector lead region contacts said second portion of said first collector lead region, and said second portion of said second collector lead region is exposed through said insulating layer so as to permit further electrical contacts therewith; and a polycrystalline base lead region of said first electrically conductive type, said base lead region including first and second portions, wherein said first portion of said base lead region contacts said base region, and said second portion of said base lead region is exposed through said insulating layer so as to permit further electrical contacts therewith.

2. A semiconductor device as defined in claim 1, wherein the polycrystalline regions comprise polycrystalline silicon.

3. A semiconductor device as defined in claim 1, wherein the polycrystalline regions comprise polycrystalline silicide.

4. A semiconductor device as defined in claim 1, further comprising a second emitter region formed in said transistor structure between said base region and said first emitter region so as to form a bi-directional transistor structure, said second emitter region being of said second electrically conductive type, wherein said bi-directional transistor structure exhibits bi-directional properties.

* * * * *